United States Patent
Oaklander et al.

(10) Patent No.: US 11,166,404 B2
(45) Date of Patent: Nov. 9, 2021

(54) SYSTEMS AND METHODS FOR VIRTUAL AGRONOMIC SENSING

(71) Applicant: FarmX Inc., Mountain View, CA (US)

(72) Inventors: Peter Oaklander, Saratoga, CA (US); Kentaro Fitzgerald Kuwata, Redwood City, CA (US); Robin Woodby, Berkeley, CA (US); William E. Jennings, San Jose, CA (US)

(73) Assignee: FarmX Inc., Mountain View, CA (US)

( * ) Notice: Subject to any disclaimer, the term of this patent is extended or adjusted under 35 U.S.C. 154(b) by 77 days.

(21) Appl. No.: 16/553,007

(22) Filed: Aug. 27, 2019

(65) Prior Publication Data

US 2020/0068784 A1 Mar. 5, 2020

Related U.S. Application Data

(60) Provisional application No. 62/726,273, filed on Sep. 2, 2018.

(51) Int. Cl.
*A01B 79/00* (2006.01)
*H04W 4/021* (2018.01)
(Continued)

(52) U.S. Cl.
CPC ............ *A01B 79/005* (2013.01); *G06F 30/20* (2020.01); *G06Q 50/02* (2013.01); *G06T 7/11* (2017.01);
(Continued)

(58) Field of Classification Search
CPC .................... A01B 79/005; G06T 7/11; G06T 2207/10032; G06T 2207/30188;
(Continued)

(56) References Cited

U.S. PATENT DOCUMENTS

RE31,023 E 9/1982 Hall, III
4,590,477 A 5/1986 Regnier et al.
(Continued)

FOREIGN PATENT DOCUMENTS

WO WO2016110832 A1 7/2016
WO WO2018085452 A1 5/2018

OTHER PUBLICATIONS

EnviroSCAN Probe, [retrieved on Dec. 14, 2016], Retrieved from the Internet: <Url:http://www.sentek.com.au/products/enviro-scan-probe.asp>, 3 pages.
(Continued)

*Primary Examiner* — Michael R Neff
(74) *Attorney, Agent, or Firm* — Carr & Ferrell LLP

(57) ABSTRACT

Systems and methods for virtual agronomic sensing are provided. In embodiments methods comprise receiving first agronomic data for a first geographic location comprising sensor data from agronomic sensors at the first geographic location; receiving first agronomic information for the first geographic location; and generating first predictive agronomic data for the first geographic location using the first agronomic data for the first geographic location and the first agronomic information for the first geographic location. Methods may further comprise testing the first predictive agronomic data for the first geographic location to be used for a second geographic location; receiving second agronomic information for the second geographic location; generating virtual agronomic sensors for the second geographic location as a function of the testing the first predictive agronomic data for the first geographic location; and providing second predictive agronomic data for the second geographic location using the virtual agronomic sensors.

20 Claims, 7 Drawing Sheets

(51) Int. Cl.
*G06Q 50/02* (2012.01)
*G06T 7/11* (2017.01)
*H04W 4/38* (2018.01)
*H04L 29/08* (2006.01)
*G06F 30/20* (2020.01)

(52) U.S. Cl.
CPC ............ *H04L 67/12* (2013.01); *H04W 4/021* (2013.01); *H04W 4/38* (2018.02); *G06T 2207/10032* (2013.01); *G06T 2207/30188* (2013.01)

(58) Field of Classification Search
CPC ......... H04W 4/38; H04W 4/021; G06F 30/20; G06Q 50/02; H04L 67/12
USPC ........................................................ 382/110
See application file for complete search history.

(56) References Cited

U.S. PATENT DOCUMENTS

| | | |
|---|---|---|
| 4,654,598 A | 3/1987 | Arulanandan et al. |
| 5,418,466 A | 5/1995 | Watson et al. |
| 5,445,178 A | 8/1995 | Feuer |
| 5,696,671 A | 12/1997 | Oliver |
| 6,014,029 A | 1/2000 | Soto et al. |
| 6,720,908 B1 | 4/2004 | Puglia |
| 6,891,444 B2 | 5/2005 | Jacobsson et al. |
| 6,977,351 B1 | 12/2005 | Woytowitz |
| 7,836,910 B2 | 11/2010 | Dresselhaus et al. |
| 8,682,494 B1 | 3/2014 | Magro et al. |
| 10,509,378 B2 | 12/2019 | Jennings et al. |
| 10,533,956 B2 | 1/2020 | Jennings |
| 10,746,720 B2 | 8/2020 | Jennings |
| 10,983,489 B2 | 4/2021 | Jennings et al. |
| 2002/0170229 A1 | 11/2002 | Ton et al. |
| 2004/0145379 A1 | 7/2004 | Buss |
| 2004/0239338 A1 | 12/2004 | Jonsson et al. |
| 2006/0057997 A1 | 3/2006 | Hausdorf et al. |
| 2006/0144437 A1 | 7/2006 | Dresselhaus et al. |
| 2006/0227661 A1 | 10/2006 | Shook et al. |
| 2009/0326723 A1 | 12/2009 | Moore et al. |
| 2010/0257633 A1 | 10/2010 | Pogson et al. |
| 2012/0084115 A1 | 4/2012 | Cline et al. |
| 2012/0306257 A1 | 12/2012 | Silversides et al. |
| 2013/0341420 A1 | 12/2013 | Lister et al. |
| 2014/0088770 A1 | 3/2014 | Masters et al. |
| 2014/0117468 A1 | 5/2014 | Parris et al. |
| 2014/0326801 A1 | 11/2014 | Upadhyaya et al. |
| 2015/0081058 A1 | 3/2015 | Oliver et al. |
| 2015/0247787 A1 | 9/2015 | Yeomans |
| 2015/0268218 A1 | 9/2015 | Troxler |
| 2015/0278719 A1 | 10/2015 | Schueller et al. |
| 2015/0301536 A1 | 10/2015 | Martinez |
| 2016/0037709 A1 | 2/2016 | Sauder et al. |
| 2016/0135389 A1 | 5/2016 | Ersavas et al. |
| 2016/0183484 A1 | 6/2016 | Richings, Sr. et al. |
| 2016/0202227 A1 | 7/2016 | Mathur et al. |
| 2017/0108452 A1 | 4/2017 | Carlson |
| 2017/0172077 A1 | 6/2017 | Wouhaybi et al. |
| 2017/0176572 A1 | 6/2017 | Charvat et al. |
| 2017/0311559 A1 | 11/2017 | Ebert et al. |
| 2018/0080861 A1 | 3/2018 | Lafian |
| 2018/0129175 A1 | 5/2018 | Jennings et al. |
| 2018/0146631 A1 | 5/2018 | Haran et al. |
| 2018/0146632 A1 | 5/2018 | Meron |
| 2018/0164230 A1 | 6/2018 | Jennings |
| 2018/0164762 A1 | 6/2018 | Mewes et al. |
| 2018/0202988 A1 | 7/2018 | Jennings |
| 2018/0252694 A1 | 9/2018 | Mase et al. |
| 2018/0259496 A1 | 9/2018 | McPeek |
| 2018/0368339 A1 | 12/2018 | van der Lee |
| 2020/0026250 A1 | 1/2020 | Jennings et al. |
| 2020/0296906 A1 | 9/2020 | Sun et al. |
| 2020/0383284 A1 | 12/2020 | Larsen |
| 2021/0073925 A1 | 3/2021 | Singh et al. |
| 2021/0208124 A1 | 7/2021 | Jennings |
| 2021/0232108 A1 | 7/2021 | Jennings et al. |

OTHER PUBLICATIONS

Liquid Sensing at Radio Frequencies, Complex impedance measurement of liquid samples as a function of frequency, [retrieved on Jan. 13, 2017] Microwave Journal, Thomas J. Wamagiris, Sep. 1, 2000, (http://www.microwavejournal.com/articles/3038-liquid-sensing-at-radio-frequencies), 9 pages.

"International Search Report" and "Written Opinion of the International Searching Authority", Patent Cooperation Treaty Application No. PCT/US2017/059597, dated Jan. 25, 2018, 9 pages.

Berni et al., "Mapping Canopy Conductance and CWSI in Olive Orchards Using High Resolution Thermal Remote Sensing Imagery", in: Remote Sensing Environment 113 [online], Jun. 28, 2009 [retrieved on Jan. 4, 2018], Retrieved from the Internet: <URL:https://www.sciencedirect.com/science/article/pii/S0034425709002090>, pp. 2380-2388.

Smith, Adam Brook, "Soil Moisture Monitoring with Ground-Based Gravity Data," Dissertation University of Melbourne, Department of Infrastructure Engineers, 2013, 397 pages.

SOIL PERCOLATION FORMULAS

PRIMARY FORMULA 1: WATER BALANCE $$Q_s(t) = R(t) - g(t) - ET(t) - F_z(t)$$

PURPOSE OF THIS FORMULA:

- EVALUATE WATER BALANCE SOIL ENVIRONMENT SYSTEM BY CALCULATING SURPLUS WATER FROM EXCESSIVE IRRIGATION

PRIMARY FORMULA 2: SOIL MOISTURE PREDICTION $$\theta(t + \Delta t) = \theta(t) + \int_{t}^{t+\Delta t} g(t)dt - \int_{t}^{t+\Delta t} ET(t)dt - \int_{t}^{t+\Delta t} F(t)dt$$

PURPOSE OF THIS FORMULA:

- EVALUATE EACH FACTOR OF SOIL MOISTURE CHANGE (INFILTRATION, ET AND PERCOLATION) BY CALCULATING AMOUNT OF SOIL MOISTURE CHANGE
- ESTIMATE HOW MUCH AMOUNT OF WATER FLOWING FROM IRRIGATION OR RAINFALL AND PERCOLATING INTO DEEPER LAYER OF SOIL

FIG. 3

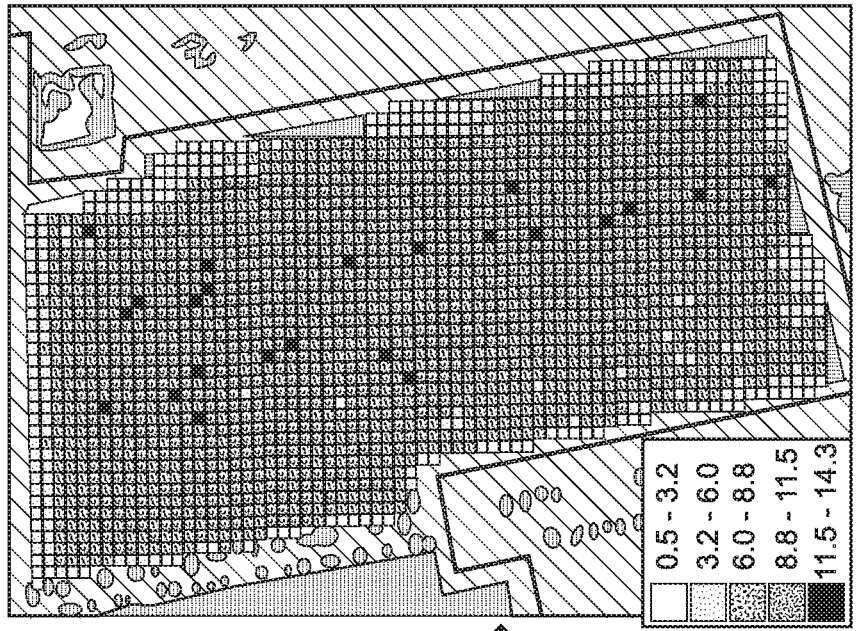
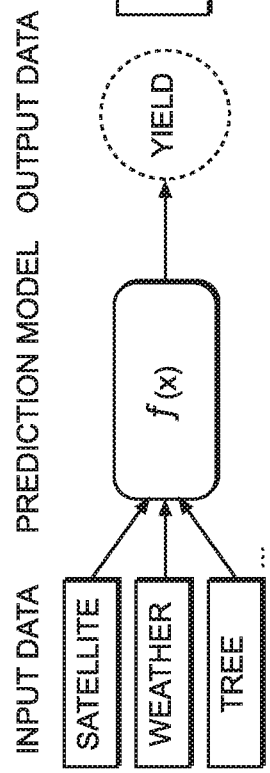
FIG. 4

```
┌─────────────────────────────────────────────────┐
│ RECEIVING FIRST AGRONOMIC DATA FOR A FIRST      │
│ GEOGRAPHIC LOCATION, THE FIRST AGRONOMIC DATA   │
│ FOR THE FIRST GEOGRAPHIC LOCATION COMPRISING    │
│ SENSOR DATA FROM ONE OR MORE AGRONOMIC SENSORS  │
│ AT THE FIRST GEOGRAPHIC LOCATION;               │
│ 710                                             │
└─────────────────────────────────────────────────┘
                         │
                         ▼
┌─────────────────────────────────────────────────┐
│ RECEIVING FIRST AGRONOMIC INFORMATION FOR THE   │
│ FIRST GEOGRAPHIC LOCATION;                      │
│ 720                                             │
└─────────────────────────────────────────────────┘
                         │
                         ▼
┌─────────────────────────────────────────────────┐
│ GENERATING FIRST PREDICTIVE AGRONOMIC DATA FOR  │
│ THE FIRST GEOGRAPHIC LOCATION USING THE FIRST   │
│ AGRONOMIC DATA FOR THE FIRST GEOGRAPHIC         │
│ LOCATION AND THE FIRST AGRONOMIC INFORMATION    │
│ FOR THE FIRST GEOGRAPHIC LOCATION;              │
│ 730                                             │
└─────────────────────────────────────────────────┘
                         │
                         ▼
┌─────────────────────────────────────────────────┐
│ TESTING THE FIRST PREDICTIVE AGRONOMIC DATA FOR │
│ THE FIRST GEOGRAPHIC LOCATION TO BE USED FOR A  │
│ SECOND GEOGRAPHIC LOCATION;                     │
│ 740                                             │
└─────────────────────────────────────────────────┘
                         │
                         ▼
┌─────────────────────────────────────────────────┐
│ RECEIVING SECOND AGRONOMIC INFORMATION FOR THE  │
│ SECOND GEOGRAPHIC LOCATION;                     │
│ 750                                             │
└─────────────────────────────────────────────────┘
                         │
                         ▼
┌─────────────────────────────────────────────────┐
│ GENERATING ONE OR MORE VIRTUAL AGRONOMIC        │
│ SENSORS FOR THE SECOND GEOGRAPHIC LOCATION AS A │
│ FUNCTION OF THE TESTING THE FIRST PREDICTIVE    │
│ AGRONOMIC DATA FOR THE FIRST GEOGRAPHIC         │
│ LOCATION; AND                                   │
│ 760                                             │
└─────────────────────────────────────────────────┘
                         │
                         ▼
┌─────────────────────────────────────────────────┐
│ PROVIDING SECOND PREDICTIVE AGRONOMIC DATA FOR  │
│ THE SECOND GEOGRAPHIC LOCATION USING THE ONE OR │
│ MORE VIRTUAL AGRONOMIC SENSORS FOR THE SECOND   │
│ GEOGRAPHIC LOCATION.                            │
│ 770                                             │
└─────────────────────────────────────────────────┘
```

FIG. 7

SYSTEMS AND METHODS FOR VIRTUAL AGRONOMIC SENSING

CROSS REFERENCE TO RELATED APPLICATION

This application claims the priority benefit of U.S. Provisional Patent Application Ser. No. 62/726,273 filed on Sep. 2, 2018, and titled "Systems and Methods for Virtual Agronomic Sensing," which is hereby incorporated by reference in its entirety.

FIELD OF THE TECHNOLOGY

Embodiments of the disclosure relate to virtual agronomic sensing. In particular, the present disclosure relates to systems and methods for virtual agronomic sensing using agronomic sensors.

SUMMARY

In some embodiments the present disclosure is directed to a system of one or more computers which can be configured to perform particular operations or actions by virtue of having software, firmware, hardware, or a combination thereof installed on the system that in operation causes or cause the system to perform actions and/or method steps as described herein.

Various embodiments of the present technology include a system for virtual agronomic sensing, comprising: (a) one or more agronomic sensors at a first geographic location; (b) at least one processor; and (c) a memory storing processor-executable instructions, wherein the at least one processor is configured to implement the following operations upon executing the processor-executable instructions: (i) receiving first agronomic data for the first geographic location, the first agronomic data for the first geographic location comprising sensor data from the one or more agronomic sensors at the first geographic location; (ii) receiving first agronomic information for the first geographic location; (iii) generating first predictive agronomic data for the first geographic location using the first agronomic data for the first geographic location and the first agronomic information for the first geographic location; (iv) testing the first predictive agronomic data for the first geographic location to be used for a second geographic location; (v) receiving second agronomic information for the second geographic location; (vi) generating one or more virtual agronomic sensors for the second geographic location as a function of the testing the first predictive agronomic data for the first geographic location; and (vii) providing second predictive agronomic data for the second geographic location using the one or more virtual agronomic sensors for the second geographic location.

In various embodiments the one or more agronomic sensors at the first geographic location comprise water pressure sensors in an irrigation system, the water pressure sensors directly measuring water delivery in the irrigation system and monitoring water leaks in the irrigation system.

In some embodiments the water pressure sensors in the irrigation system are correlated with satellite imaging.

In various embodiments the one or more agronomic sensors at the first geographic location comprise soil moisture sensors; wherein the first agronomic data for the first geographic location comprises soil moisture content; wherein the first agronomic information for the first geographic location comprises soil type and rainfall; wherein the first predictive agronomic data for the first geographic location comprises soil moisture content; wherein the second agronomic information for the second geographic location comprises soil type and rainfall; wherein the one or more virtual agronomic sensors for the second geographic location comprise virtual soil moisture sensors; and wherein the second predictive agronomic data for the second geographic location comprises irrigation levels.

In some embodiments wherein the one or more agronomic sensors at the first geographic location comprise frost sensors; wherein the first agronomic data for the first geographic location comprises frost formation; wherein the first agronomic information for the first geographic location comprises weather data; wherein the first predictive agronomic data for the first geographic location comprises frost formation; wherein the second agronomic information for the second geographic location comprises weather data; wherein the one or more virtual agronomic sensors for the second geographic location comprise frost sensors; and wherein the second predictive agronomic data for the second geographic location comprises frost formation.

In some embodiments the weather data comprises air temperature, humidity, and frost formation.

In various embodiments wherein the one or more agronomic sensors at the first geographic location comprise leaf temperature sensors; wherein the first agronomic data for the first geographic location comprises leaf temperature, the leaf temperature indicating crop stress; wherein the first agronomic information for the first geographic location comprises weather data; wherein the first predictive agronomic data for the first geographic location comprises leaf temperature, the leaf temperature indicating crop stress; wherein the second agronomic information for the second geographic location comprises weather data; wherein the one or more virtual agronomic sensors for the second geographic location comprise virtual leaf temperature sensors; and wherein the second predictive agronomic data for the second geographic location comprises crop stress.

In some embodiments wherein the one or more agronomic sensors at the first geographic location comprise weather sensors; wherein the first agronomic data for the first geographic location comprises weather data and satellite images; wherein the first agronomic information for the first geographic location comprises historical crop yield for the first geographic location; wherein the first predictive agronomic data for the first geographic location comprises crop yield for the first geographic location; wherein the second agronomic information for the second geographic location comprises weather data and satellite images; wherein the one or more virtual agronomic sensors for the second geographic location comprise virtual weather sensors; and wherein the second predictive agronomic data for the second geographic location comprises crop yield prediction.

In various embodiments the at least one processor is further configured to implement the operation of receiving additional relevant data for the second geographic location; wherein the generating the one or more virtual agronomic sensors for the second geographic location is further a function of the additional relevant data for the second geographic location; and wherein the providing the second predictive agronomic data for the second geographic location uses the additional relevant data for the second geographic location.

BRIEF DESCRIPTION OF THE DRAWINGS

The accompanying drawings, where like reference numerals refer to identical or functionally similar elements throughout the separate views, together with the detailed description below, are incorporated in and form part of the specification, and serve to further illustrate embodiments of concepts that include the claimed disclosure, and explain various principles and advantages of those embodiments.

The methods and systems disclosed herein have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

FIG. 3 is a diagram of water percolation formulas according to exemplary embodiments of the present technology.

FIG. 4 is a simplified diagram of a yield prediction model according to exemplary embodiments of the present technology.

FIG. 7 illustrates an exemplary method according to exemplary embodiments of the present technology.

DETAILED DESCRIPTION

Figure 1:
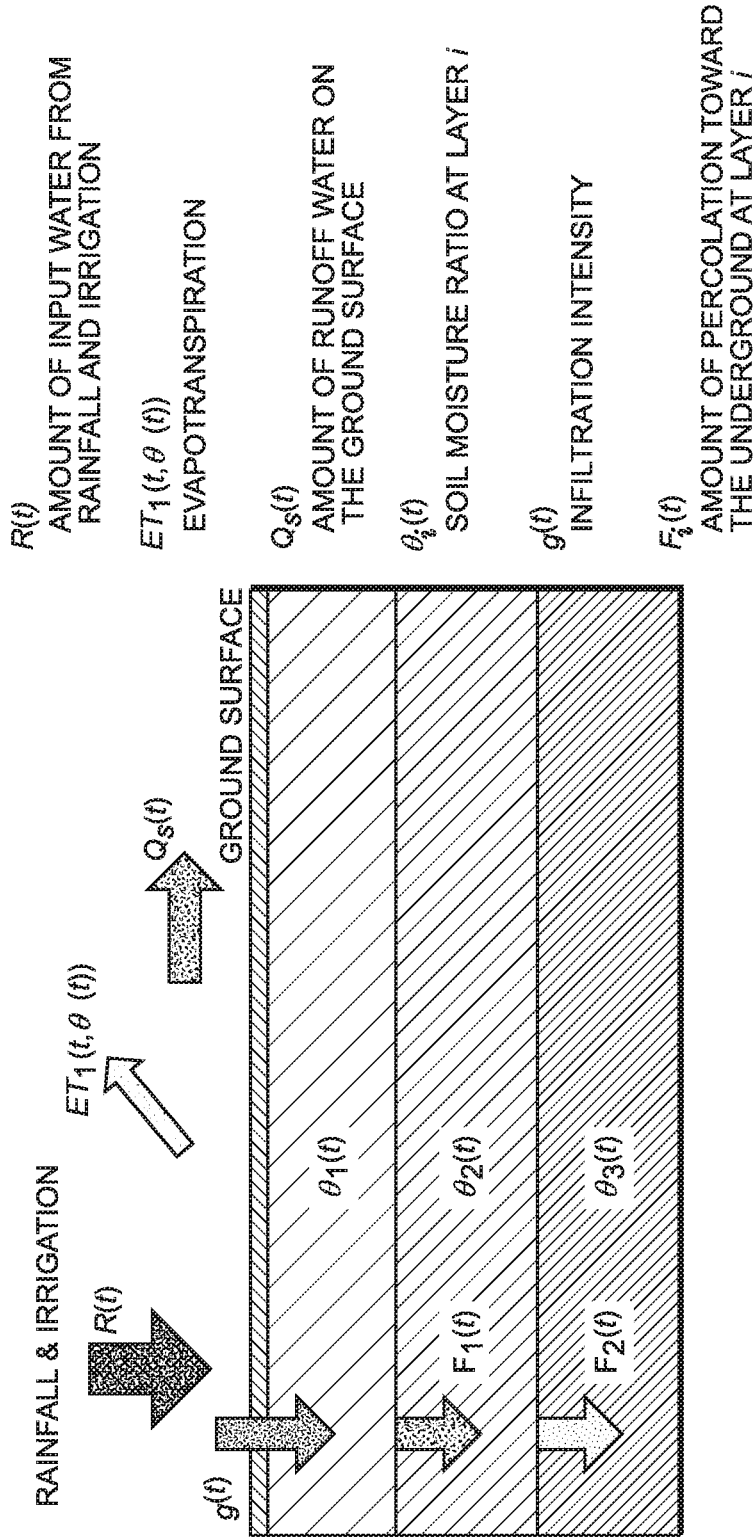
FIG. 1 is a simplified diagram of water percolation in multiple soil layers according to exemplary embodiments of the present technology.

While this technology is susceptible of embodiment in many different forms, there is shown in the drawings and will herein be described in detail several specific embodiments with the understanding that the present disclosure is to be considered as an exemplification of the principles of the technology and is not intended to limit the technology to the embodiments illustrated.

FIG. 1 is a simplified diagram of water percolation in multiple soil layers according to exemplary embodiments of the present technology. For example, in some embodiments, the one or more agronomic sensors at the first location comprise: soil moisture sensors. Simulation of water percolation in multiple soil layers is accomplished by gathering various soil and weather measurements and is used for providing predicative agronomic data. For example, the various measurements include an amount of input water from rainfall and irrigation [R(t)], evapotranspiration [$ET_1$ (t, θ(t))], amount of runoff water on the ground surface [$Q_s$(t)], soil moisture ratio at a layer (i) [$θ_i$(t)], infiltration intensity [g(t)], and amount of percolation towards underground at the layer (i) [$F_i$(t)].

Figure 2:
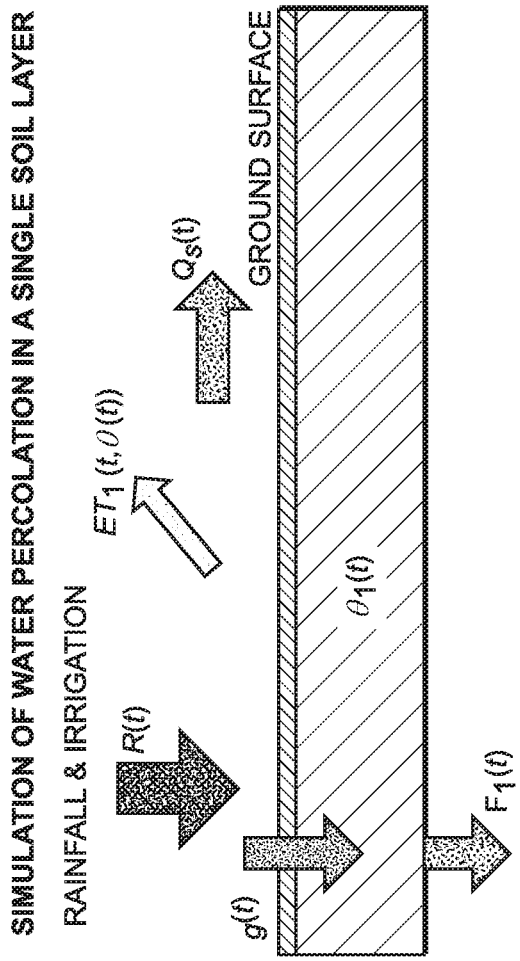
FIG. 2 is a simplified diagram of water percolation in a single soil layer according to exemplary embodiments of the present technology.

FIG. 2 is a simplified diagram of water percolation in a single soil layer according to exemplary embodiments of the present technology. Simulation of water percolation in a single soil layer is accomplished by gathering various soil measurements and is used for providing predicative agronomic data. For example, an amount of input water from rainfall and irrigation [R(t)], evapotranspiration [$ET_1$ (t, θ(t))], amount of runoff water on the ground surface [$Q_s$(t)], infiltration intensity [g(t)], and amount of percolation towards underground at the layer [$F_i$(t)] are used to simulate water percolation in a single soil layer (e.g., layer (i)).

FIG. 3 is a diagram of water percolation formulas according to exemplary embodiments of the present technology. In various embodiments a water balance formula and a soil moisture prediction formula are used for providing predicative agronomic data. For example, a water balance formula is as follows:

$$Q_s(t)=R(t)-g(t)-ET(t)-F_i(t)$$

In some embodiments, the water balance formula evaluates water balance of a soil environment system by calculating surplus water from excessive irrigation. For example, soil moisture prediction formula is as follows:

$$θ(t+\Delta t)=θ(t)+\int_t^{t+\Delta t}g(t)dt-\int_t^{t+\Delta t}ET(t)dt-\int_t^{t+\Delta t}F(t)dt$$

In various embodiments, the soil moisture prediction formula evaluates each factor of soil moisture change by calculating an amount of soil moisture change. Furthermore, the soil moisture prediction formula estimates how much water is flowing from irrigation or rainfall and percolating into a deeper layer of soil.

FIG. 4 is a simplified diagram of a yield prediction model according to exemplary embodiments of the present technology. In some embodiments input data is feed into a prediction model to produce a yield prediction. A yield prediction model is trained with satellite images, weather reports and orchard locations as input data, and historical yield data as output data by using a Hierarchical Bayesian model. In some embodiments, the yield prediction is extended from a field level to an entire area of the field as well as other fields.

Figure 5:
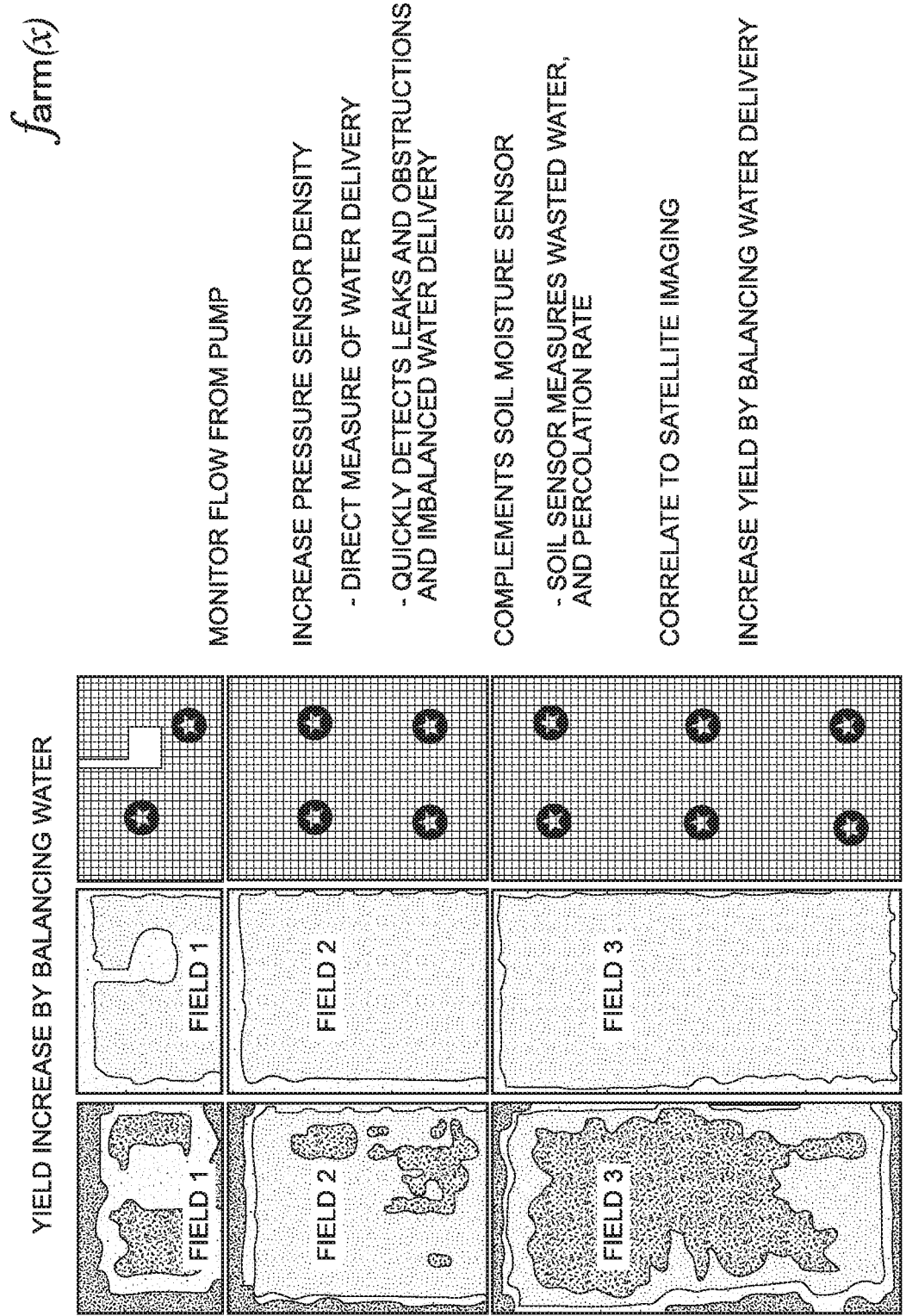
FIG. 5 is a simplified diagram of yield increases by balancing water according to exemplary embodiments of the present technology.

FIG. 5 is a simplified diagram of yield increases by balancing water according to exemplary embodiments of the present technology. In various embodiments, the one or more agronomic sensors at the first location comprise water pressure sensors in an irrigation system, the water pressure sensors directly measuring water delivery in the irrigation system and monitoring water leaks in the irrigation system. For example, the water pressure sensors monitor flow from a pump in the irrigation system. In exemplary embodiments, an increase in pressure sensor density is a direct measure of water delivery and quickly detects leaks and obstructions in the irrigation system as well as imbalanced water delivery. In some embodiments, the water pressure sensors measure an amount of water in the irrigation system that is correlated with satellite imaging. In various embodiments yield is increased by balancing water delivery in the irrigation system. For example, increased yields are accomplished by maximizing effectiveness of water and nutrients applied by a combination of granular sensing of soil, virtual soil, water pressure, plant sensors, and satellite images. In various embodiments, varying granularity of various combinations of sensing of soil, virtual soil, water pressure, plant sensors, and satellite images are used to maximize effectiveness of water and nutrients to produce increased yields.

Figure 6:
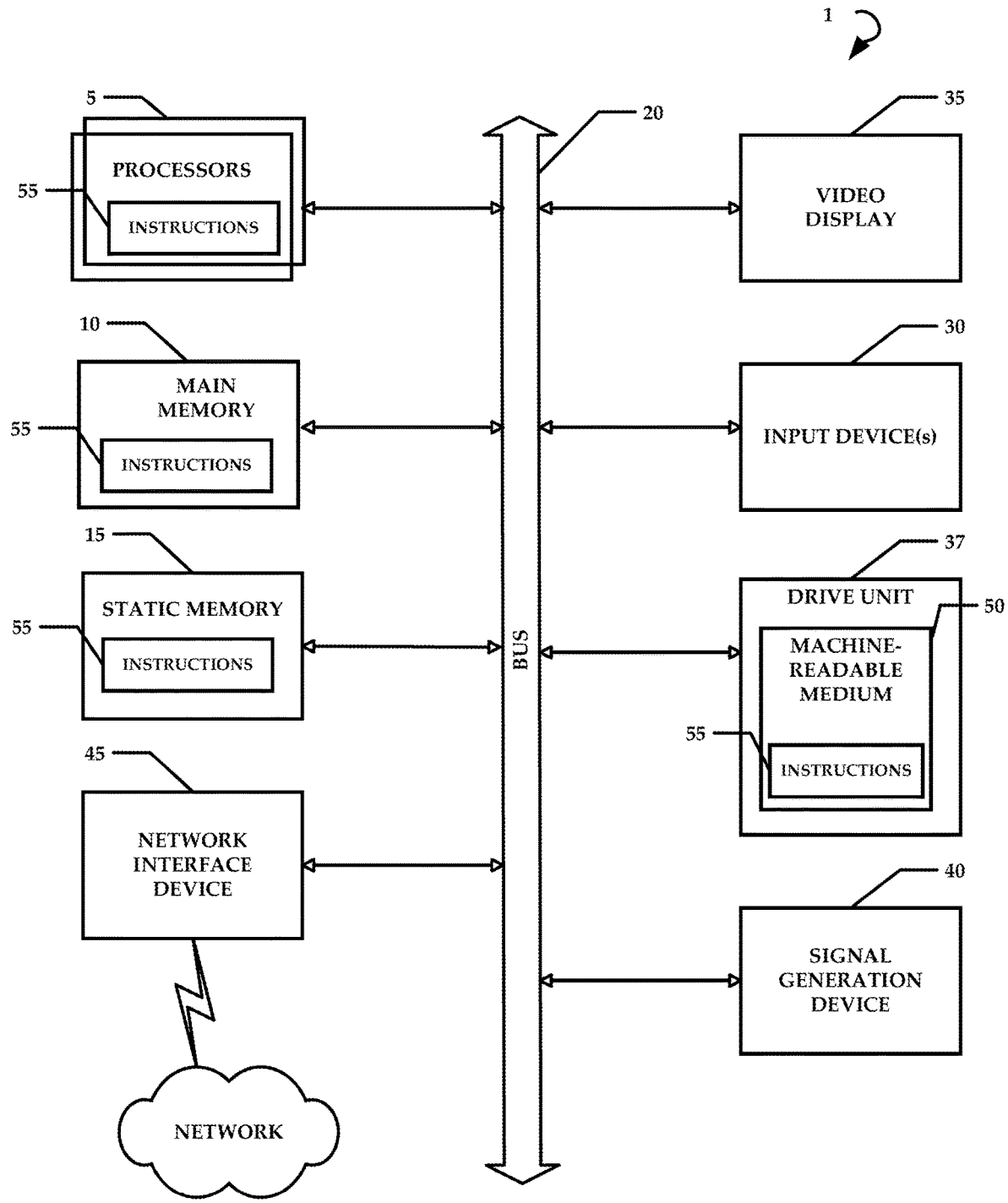
FIG. 6 illustrates a computer system used to practice aspects of the present technology.

FIG. 6 is a diagrammatic representation of an example machine in the form of a computer system 1, within which a set of instructions for causing the machine to perform any one or more of the methodologies discussed herein may be executed. In various example embodiments, the machine operates as a standalone device or may be connected (e.g., networked) to other machines. In a networked deployment, the machine may operate in the capacity of a server or a client machine in a server-client network environment, or as a peer machine in a peer-to-peer (or distributed) network environment. The machine may be a microprocessor chip or system on a chip (SOC) personal computer (PC), a tablet PC, a set-top box (STB), a personal digital assistant (PDA), a cellular telephone, a smart phone with combination of said functions a portable music player (e.g., a portable hard drive audio device such as an Moving Picture Experts Group Audio Layer 3 (MP3) player), a web appliance, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 1 includes a processor or multiple processor(s) 5 (e.g., a central processing unit (CPU), a graphics processing unit (GPU), or both), and a main memory 10 and static memory 15, which communicate with each other via a bus 20. The computer system 1 may further include a video display 35 (e.g., a liquid crystal display (LCD)). The computer system 1 may also include an alpha-numeric input device(s) 30 (e.g., a keyboard), a cursor control device (e.g., a mouse), a voice recognition or biometric verification unit (not shown), a drive unit 37 (also referred to as disk drive unit), a signal generation device 40 (e.g., a speaker), and a network interface device 45. The computer system 1 may further include a data encryption module (not shown) to encrypt data.

The disk drive unit 37 includes a computer or machine-readable medium 50 on which is stored one or more sets of instructions and data structures (e.g., instructions 55) embodying or utilizing any one or more of the methodologies or functions described herein. The instructions 55 may also reside, completely or at least partially, within the main memory 10 and/or within the processor(s) 5 during execution thereof by the computer system 1. The main memory 10 and the processor(s) 5 may also constitute machine-readable media.

The instructions 55 may further be transmitted or received over a network via the network interface device 45 utilizing any one of a number of well-known transfer protocols (e.g., Hyper Text Transfer Protocol (HTTP)). While the machine-readable medium 50 is shown in an example embodiment to be a single medium, the term "computer-readable medium" should be taken to include a single medium or multiple media (e.g., a centralized or distributed database and/or associated caches and servers) that store the one or more sets of instructions. The term "computer-readable medium" shall also be taken to include any medium that is capable of storing, encoding, or carrying a set of instructions for execution by the machine and that causes the machine to perform any one or more of the methodologies of the present application, or that is capable of storing, encoding, or carrying data structures utilized by or associated with such a set of instructions. The term "computer-readable medium" shall accordingly be taken to include, but not be limited to, solid-state memories, optical and magnetic media, and carrier wave signals. Such media may also include, without limitation, hard disks, floppy disks, flash memory cards, digital video disks, random access memory (RAM), read only memory (ROM), and the like. The example embodiments described herein may be implemented in an operating environment comprising software installed on a computer, in hardware, or in a combination of software and hardware.

One skilled in the art will recognize that the Internet service may be configured to provide Internet access to one or more computing devices that are coupled to the Internet service, and that the computing devices may include one or more processors, buses, memory devices, display devices, input/output devices, and the like. Furthermore, those skilled in the art may appreciate that the Internet service may be coupled to one or more databases, repositories, servers, and the like, which may be utilized in order to implement any of the embodiments of the disclosure as described herein.

The corresponding structures, materials, acts, and equivalents of all means or step plus function elements in the claims below are intended to include any structure, material, or act for performing the function in combination with other claimed elements as specifically claimed. The description of the present technology has been presented for purposes of illustration and description, but is not intended to be exhaustive or limited to the present technology in the form disclosed. Many modifications and variations will be apparent to those of ordinary skill in the art without departing from the scope and spirit of the present technology. Exemplary embodiments were chosen and described in order to best explain the principles of the present technology and its practical application, and to enable others of ordinary skill in the art to understand the present technology for various embodiments with various modifications as are suited to the particular use contemplated.

Aspects of the present technology are described above with reference to flowchart illustrations and/or block diagrams of methods, apparatus (systems) and computer program products according to embodiments of the present technology. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present technology. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In the following description, for purposes of explanation and not limitation, specific details are set forth, such as particular embodiments, procedures, techniques, etc. in order to provide a thorough understanding of the present invention. However, it will be apparent to one skilled in the art that the present invention may be practiced in other embodiments that depart from these specific details.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" or "according to one embodiment" (or other phrases having similar import) at various places throughout this specification are not necessarily all referring to the same embodiment. Furthermore, the particular features, structures, or characteristics may be combined in any suitable manner in one or more embodiments. Furthermore, depending on the context of discussion herein, a singular term may include its plural forms and a plural term may include its singular form. Similarly, a hyphenated term (e.g., "on-demand") may be occasionally interchangeably used with its non-hyphenated version (e.g., "on demand"), a capitalized entry (e.g., "Software") may be interchangeably used with its non-capitalized version (e.g., "software"), a plural term may be indicated with or without an apostrophe (e.g., PE's or PEs), and an italicized term (e.g., "N+1") may be interchangeably used with its non-italicized version (e.g., "N+1"). Such occasional interchangeable uses shall not be considered inconsistent with each other.

Also, some embodiments may be described in terms of "means for" performing a task or set of tasks. It will be understood that a "means for" may be expressed herein in terms of a structure, such as a processor, a memory, an I/O device such as a camera, or combinations thereof. Alternatively, the "means for" may include an algorithm that is descriptive of a function or method step, while in yet other embodiments the "means for" is expressed in terms of a mathematical formula, prose, or as a flow chart or signal diagram.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It is noted at the outset that the terms "coupled," "connected", "connecting," "electrically connected," etc., are used interchangeably herein to generally refer to the condition of being electrically/electronically connected. Similarly, a first entity is considered to be in "communication" with a second entity (or entities) when the first entity electrically sends and/or receives (whether through wireline or wireless means) information signals (whether containing data information or non-data/control information) to the second entity regardless of the type (analog or digital) of those signals. It is further noted that various figures (including component diagrams) shown and discussed herein are for illustrative purpose only, and are not drawn to scale.

While specific embodiments of, and examples for, the system are described above for illustrative purposes, various equivalent modifications are possible within the scope of the system, as those skilled in the relevant art will recognize. For example, while processes or steps are presented in a given order, alternative embodiments may perform routines having steps in a different order, and some processes or steps may be deleted, moved, added, subdivided, combined, and/or modified to provide alternative or sub-combinations. Each of these processes or steps may be implemented in a variety of different ways. Also, while processes or steps are at times shown as being performed in series, these processes or steps may instead be performed in parallel, or may be performed at different times.

While various embodiments have been described above, it should be understood that they have been presented by way of example only, and not limitation. The descriptions are not intended to limit the scope of the invention to the particular forms set forth herein. To the contrary, the present descriptions are intended to cover such alternatives, modifications, and equivalents as may be included within the spirit and scope of the invention as defined by the appended claims and otherwise appreciated by one of ordinary skill in the art. Thus, the breadth and scope of a preferred embodiment should not be limited by any of the above-described exemplary embodiments.

FIG. 7 illustrates an exemplary method according to exemplary embodiments of the present technology. FIG. 7 shows a method 700 for virtual agronomic sensing, including the following steps. The method 700 of FIG. 7 shows receiving 710 first agronomic data for a first geographic location, the first agronomic data for the first geographic location comprising sensor data from one or more agronomic sensors at the first geographic location. The method 700 of FIG. 7 shows receiving 720 first agronomic information for the first geographic location. The method 700 of FIG. 7 further shows generating 730 first predictive agronomic data for the first geographic location using the first agronomic data for the first geographic location and the first agronomic information for the first geographic location. The method 700 of FIG. 7 shows testing 740 the first predictive agronomic data for the first geographic location to be used for a second geographic location. The method 700 of FIG. 7 further shows receiving 750 second agronomic information for the second geographic location. The method 700 of FIG. 7 shows generating 760 one or more virtual agronomic sensors for the second geographic location as a function of the testing the first predictive agronomic data for the first geographic location; and providing 770 second predictive agronomic data for the second geographic location using the one or more virtual agronomic sensors for the second geographic location.

What is claimed is:

1. A system for virtual agronomic sensing, comprising:
   one or more agronomic sensors at a first geographic location;
   at least one processor; and
   a memory storing processor-executable instructions, wherein the at least one processor is configured to implement the following operations upon executing the processor-executable instructions:

receiving first agronomic data for the first geographic location, the first agronomic data for the first geographic location comprising sensor data from the one or more agronomic sensors at the first geographic location;

receiving first agronomic information for the first geographic location;

generating first predictive agronomic data for the first geographic location using the first agronomic data for the first geographic location and the first agronomic information for the first geographic location;

testing the first predictive agronomic data for the first geographic location to be used for a second geographic location;

receiving second agronomic information for the second geographic location;

generating one or more virtual agronomic sensors for the second geographic location as a function of the testing the first predictive agronomic data for the first geographic location; and providing second predictive agronomic data for the second geographic location using the one or more virtual agronomic sensors for the second geographic location.

2. The system for virtual agronomic sensing of claim 1, wherein the one or more agronomic sensors at the first geographic location comprise water pressure sensors in an irrigation system, the water pressure sensors directly measuring water delivery in the irrigation system and monitoring water leaks in the irrigation system.

3. The system for virtual agronomic sensing of claim 2, wherein the water pressure sensors in the irrigation system are correlated with satellite imaging.

4. The system for virtual agronomic sensing of claim 1,
wherein the one or more agronomic sensors at the first geographic location comprise soil moisture sensors and soil percolation sensors;
wherein the first agronomic data for the first geographic location comprises soil moisture content;
wherein the first agronomic information for the first geographic location comprises soil type and rainfall;
wherein the first predictive agronomic data for the first geographic location comprises soil moisture content;
wherein the second agronomic information for the second geographic location comprises soil type and rainfall;
wherein the one or more virtual agronomic sensors for the second geographic location comprise virtual soil moisture sensors; and
wherein the second predictive agronomic data for the second geographic location comprises irrigation levels.

5. The system for virtual agronomic sensing of claim 1,
wherein the one or more agronomic sensors at the first geographic location comprise frost sensors;
wherein the first agronomic data for the first geographic location comprises frost formation;
wherein the first agronomic information for the first geographic location comprises weather data;
wherein the first predictive agronomic data for the first geographic location comprises frost formation;
wherein the second agronomic information for the second geographic location comprises weather data;
wherein the one or more virtual agronomic sensors for the second geographic location comprise frost sensors; and
wherein the second predictive agronomic data for the second geographic location comprises frost formation.

6. The system for virtual agronomic sensing of claim 5, wherein the weather data comprises air temperature, humidity, and frost formation.

7. The system for virtual agronomic sensing of claim 1,
wherein the one or more agronomic sensors at the first geographic location comprise leaf temperature sensors;
wherein the first agronomic data for the first geographic location comprises leaf temperature, the leaf temperature indicating crop stress;
wherein the first agronomic information for the first geographic location comprises weather data;
wherein the first predictive agronomic data for the first geographic location comprises leaf temperature, the leaf temperature indicating crop stress;
wherein the second agronomic information for the second geographic location comprises weather data;
wherein the one or more virtual agronomic sensors for the second geographic location comprise virtual leaf temperature sensors; and
wherein the second predictive agronomic data for the second geographic location comprises crop stress.

8. The system for virtual agronomic sensing of claim 1,
wherein the one or more agronomic sensors at the first geographic location comprise weather sensors;
wherein the first agronomic data for the first geographic location comprises weather data and satellite images;
wherein the first agronomic information for the first geographic location comprises historical crop yield for the first geographic location;
wherein the first predictive agronomic data for the first geographic location comprises crop yield for the first geographic location;
wherein the second agronomic information for the second geographic location comprises weather data and satellite images;
wherein the one or more virtual agronomic sensors for the second geographic location comprise virtual weather sensors; and
wherein the second predictive agronomic data for the second geographic location comprises crop yield prediction.

9. The system for virtual agronomic sensing of claim 1, wherein the at least one processor is further configured to implement an operation of receiving additional relevant data for the second geographic location;
wherein the generating the one or more virtual agronomic sensors for the second geographic location is further a function of the additional relevant data for the second geographic location; and
wherein the providing the second predictive agronomic data for the second geographic location uses the additional relevant data for the second geographic location.

10. A method for virtual agronomic sensing, the method comprising:
receiving first agronomic data for a first geographic location, the first agronomic data for the first geographic location comprising sensor data from one or more agronomic sensors at the first geographic location;
receiving first agronomic information for the first geographic location;
generating first predictive agronomic data for the first geographic location using the first agronomic data for the first geographic location and the first agronomic information for the first geographic location;
testing the first predictive agronomic data for the first geographic location to be used for a second geographic location;
receiving second agronomic information for the second geographic location;

generating one or more virtual agronomic sensors for the second geographic location as a function of the testing the first predictive agronomic data for the first geographic location; and providing second predictive agronomic data for the second geographic location using the one or more virtual agronomic sensors for the second geographic location.

11. The method for virtual agronomic sensing of claim 10, wherein the one or more agronomic sensors at the first geographic location comprise water pressure sensors in an irrigation system, the water pressure sensors directly measuring water delivery in the irrigation system and monitoring water leaks in the irrigation system.

12. The method for virtual agronomic sensing of claim 11, wherein the water pressure sensors in the irrigation system are correlated with satellite imaging.

13. The method for virtual agronomic sensing of claim 10,
wherein the one or more agronomic sensors at the first geographic location comprise soil moisture sensors and soil percolation sensors;
wherein the first agronomic data for the first geographic location comprises soil moisture content;
wherein the first agronomic information for the first geographic location comprises soil type and rainfall;
wherein the first predictive agronomic data for the first geographic location comprises soil moisture content;
wherein the second agronomic information for the second geographic location comprises soil type and rainfall;
wherein the one or more virtual agronomic sensors for the second geographic location comprise virtual soil moisture sensors; and
wherein the second predictive agronomic data for the second geographic location comprises irrigation levels.

14. The method for virtual agronomic sensing of claim 10,
wherein the one or more agronomic sensors at the first geographic location comprise frost sensors;
wherein the first agronomic data for the first geographic location comprises frost formation;
wherein the first agronomic information for the first geographic location comprises weather data;
wherein the first predictive agronomic data for the first geographic location comprises frost formation;
wherein the second agronomic information for the second geographic location comprises weather data;
wherein the one or more virtual agronomic sensors for the second geographic location comprise frost sensors; and
wherein the second predictive agronomic data for the second geographic location comprises frost formation.

15. The method for virtual agronomic sensing of claim 14, wherein the weather data comprises air temperature, humidity, and frost formation.

16. The method for virtual agronomic sensing of claim 10,
wherein the one or more agronomic sensors at the first geographic location comprise leaf temperature sensors;
wherein the first agronomic data for the first geographic location comprises leaf temperature, the leaf temperature indicating crop stress;
wherein the first agronomic information for the first geographic location comprises weather data;
wherein the first predictive agronomic data for the first geographic location comprises leaf temperature, the leaf temperature indicating crop stress;
wherein the second agronomic information for the second geographic location comprises weather data;
wherein the one or more virtual agronomic sensors for the second geographic location comprise virtual leaf temperature sensors; and
wherein the second predictive agronomic data for the second geographic location comprises crop stress.

17. The method for virtual agronomic sensing of claim 10,
wherein the one or more agronomic sensors at the first geographic location comprise weather sensors;
wherein the first agronomic data for the first geographic location comprises weather data and satellite images;
wherein the first agronomic information for the first geographic location comprises historical crop yield for the first geographic location;
wherein the first predictive agronomic data for the first geographic location comprises crop yield for the first geographic location;
wherein the second agronomic information for the second geographic location comprises weather data and satellite images;
wherein the one or more virtual agronomic sensors for the second geographic location comprise virtual weather sensors; and
wherein the second predictive agronomic data for the second geographic location comprises crop yield prediction.

18. The method for virtual agronomic sensing of claim 10, further comprising receiving additional relevant data for the second geographic location;
wherein the generating the one or more virtual agronomic sensors for the second geographic location is further a function of the additional relevant data for the second geographic location; and
wherein the providing the second predictive agronomic data for the second geographic location uses the additional relevant data for the second geographic location.

19. A non-transitory computer readable medium having embodied thereon instructions being executable by at least one processor to perform operations for virtual agronomic sensing, the operations comprising:
receiving first agronomic data for a first geographic location, the first agronomic data for the first geographic location comprising sensor data from one or more agronomic sensors at the first geographic location;
receiving first agronomic information for the first geographic location;
generating first predictive agronomic data for the first geographic location using the first agronomic data for the first geographic location and the first agronomic information for the first geographic location;
testing the first predictive agronomic data for the first geographic location to be used for a second geographic location;
receiving second agronomic information for the second geographic location;
generating one or more virtual agronomic sensors for the second geographic location as a function of the testing the first predictive agronomic data for the first geographic location; and
providing second predictive agronomic data for the second geographic location using the one or more virtual agronomic sensors for the second geographic location.

20. The non-transitory computer readable medium of claim 19, wherein the operations further comprise receiving additional relevant data for the second geographic location;
wherein the generating the one or more virtual agronomic sensors for the second geographic location is further a function of the additional relevant data for the second geographic location; and wherein the providing the second predictive agronomic data for the second geographic location uses the additional relevant data for the second geographic location.

* * * * *